United States Patent
Kim et al.

(10) Patent No.: US 8,344,366 B2
(45) Date of Patent: Jan. 1, 2013

(54) ORGANIC THIN FILM TRANSISTOR AND METHOD OF FORMING THE SAME

(75) Inventors: Kang Dae Kim, Daejeon (KR); In-Kyu You, Daejeon (KR); Jae Bon Koo, Daejeon (KR); Yong Suk Yang, Daejeon (KR); Seung Youl Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 99 days.

(21) Appl. No.: 12/858,868

(22) Filed: Aug. 18, 2010

(65) Prior Publication Data

US 2011/0204334 A1    Aug. 25, 2011

(30) Foreign Application Priority Data

Feb. 19, 2010   (KR) .......................... 10-2010-0015052

(51) Int. Cl.
*H01L 51/10*   (2006.01)

(52) U.S. Cl. ...................... 257/40; 257/66; 257/E51.006
(58) Field of Classification Search .................... 257/40, 257/66, E51.006
See application file for complete search history.

(56) References Cited

U.S. PATENT DOCUMENTS

| 6,207,472 B1 | 3/2001 | Callegari et al. |
| 2006/0284181 A1* | 12/2006 | Chae et al. ...................... 257/66 |
| 2008/0135836 A1 | 6/2008 | Gelinck et al. |

FOREIGN PATENT DOCUMENTS

| KR | 2006-0078007 A | 7/2006 |
| KR | 10-0678771 A | 1/2007 |
| KR | 2009-0045884 A | 5/2009 |

OTHER PUBLICATIONS

Leszek Artur Majewski et al., "One Volt Organic Transistor", Advanced Materials, vol. 17, No. 2, pp. 192-196, 2005.
M. Halik et al., "Low-voltage organic transistors with an amorphous molecular gate dielectric", Nature Publishing Group, vol. 431, pp. 963-966, Oct. 21, 2004.

* cited by examiner

*Primary Examiner* — Long Pham
(74) *Attorney, Agent, or Firm* — Rabin & Berdo, P.C.

(57) ABSTRACT

Provided are an organic thin film transistor and a method of forming the same. The method comprises forming a gate electrode on a substrate, forming a gate dielectric, which covers the gate electrode and includes a recess region at an upper portion, on the substrate, forming a source electrode and a drain electrode in the recess region, and forming an organic semiconductor layer between the source electrode and the drain electrode in the recess region.

14 Claims, 5 Drawing Sheets

ORGANIC THIN FILM TRANSISTOR AND METHOD OF FORMING THE SAME

CROSS-REFERENCE TO RELATED APPLICATIONS

This U.S. non-provisional patent application claims priority under 35 U.S.C. §119 of Korean Patent Application No. 10-2010-0015052, filed on February 19, the entire contents of which are hereby incorporated by reference.

BACKGROUND OF THE INVENTION

The present invention disclosed herein relates to a transistor and a method of forming the same, and more particularly, to an organic thin film transistor and a method of forming the same.

Generally, an organic thin film transistor includes a gate electrode that is formed on a substrate, source and drain electrodes that are electrically insulated from the gate electrode by a gate dielectric, and an organic semiconductor layer that is formed on a gate dielectric between the source and drain electrodes.

The organic semiconductor layer is formed in various and flexible synthesis methods and it is formed at relatively low cost. Moreover, since the organic semiconductor layer may be easily formed in a printing process, it may be applied to large-area devices. Because of these features, attempts are being continuously made for applying the organic semiconductor layer to electronic products such as flexible displays and Radio Frequency Identification (RFID) tags.

However, for using the organic semiconductor layer as the key elements of the flexible displays and RFID tags, low power consumption is required. Typical organic thin film transistors may operate at a high operating voltage, for example, 20 V or higher. This is caused by the thickness of a gate dielectric, which may commonly have a large thickness of 100 nm or more.

For solving these limitations, various researches are being continuously made in the art. For example, some researches have proposed technologies that form a gate dielectric with tantalum oxide, vanadium oxide or titanium oxide through a sputtering process. However, such technologies use a vacuum process, and thus it costs a great deal.

SUMMARY OF THE INVENTION

The present invention provides an organic thin film transistor having operation characteristic improved and a method of forming the same.

Embodiments of the present invention provide a method of forming organic thin film transistor including: forming a gate electrode on a substrate; forming a gate dielectric, which covers the gate electrode and includes a recess region at an upper portion, on the substrate; forming a source electrode and a drain electrode in the recess region; and forming an organic semiconductor layer between the source electrode and the drain electrode in the recess region.

In some embodiments, the forming of a gate dielectric may include: forming an auxiliary gate dielectric on the substrate; and performing an imprinting process with a mold having a convex portion to form the recess region at an upper portion of the auxiliary gate dielectric.

In other embodiments, the forming of a gate dielectric may further include curing the auxiliary gate dielectric after forming the recess region.

In still other embodiments, the forming of a gate dielectric may include: forming a first gate dielectric between the gate electrode and the recess region; and forming a second gate dielectric between the substrate and the recess region, wherein a thickness of the first gate dielectric may be thinner than a thickness of the second gate dielectric, and a thickness of the auxiliary gate dielectric is thicker than a thickness of the second gate dielectric.

In even other embodiments, the auxiliary gate dielectric may be formed of an organic insulator.

In yet other embodiments, the forming of a source electrode and a drain electrode may include: forming a conductive layer in the recess region; and curing a conductive layer which is formed at both sides of the gate electrode.

In further embodiments, the curing of a conductive layer may include performing an exposure process on the conductive layer by using the gate electrode as a mask.

In still further embodiments, the gate dielectric may be formed of an ultraviolet-transmissive insulating material.

In even further embodiments, the source electrode and the drain electrode may be formed so as to be self-aligned with the gate electrode.

In yet further embodiments, the conductive layer may be formed of an ink of conductivity.

In much further embodiments, the conductive layer may be formed in an inkjet printing process.

In still much further embodiments, the forming of the source electrode and the drain electrode may further include removing the conductive layer between the source electrode and the drain electrode after curing the conductive layer.

In yet further embodiments, the organic semiconductor layer may be formed so as to be self-aligned with the source electrode and the drain electrode.

In even much further embodiments, the organic semiconductor layer may be formed in an inkjet printing process.

In other embodiments of the present invention, an organic thin film transistor includes: a gate electrode on a substrate; a gate dielectric covering the gate electrode and including a recess region at an upper portion, on the substrate; a source electrode and a drain electrode disposed in the recess region; and an organic semiconductor layer disposed between the source electrode and the drain electrode in the recess region.

In some embodiments, lower surfaces of the source electrode, the drain electrode and the organic semiconductor layer may be parallel to an upper surface of the substrate.

In other embodiments, the gate dielectric may include: a first gate dielectric disposed between the gate electrode and the organic semiconductor layer; a second gate dielectric disposed between the source electrode and the substrate and between the drain electrode and the substrate; and a third gate dielectric on the substrate, and including an upper surface having the same height as height of upper surfaces of the source electrode and drain electrode.

In still other embodiments, a thickness of the third gate dielectric may be the same as a sum of a thickness of the source electrode or drain electrode, a thickness of the first gate dielectric and a thickness of the gate electrode.

In even other embodiments, the source electrode and the drain electrode may be self-aligned with the gate electrode and disposed.

In yet other embodiments, the organic semiconductor layer may be disposed so as to be self-aligned with the source electrode and the drain electrode.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1A:
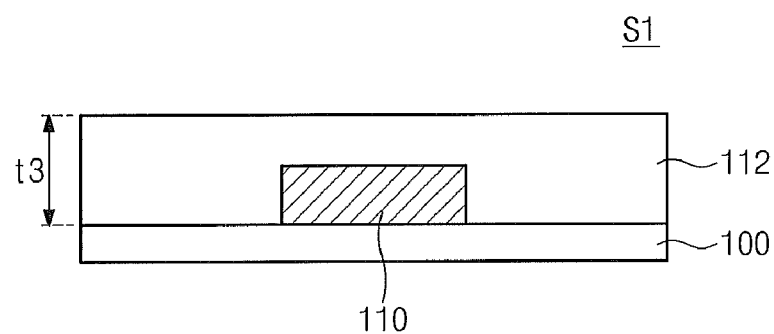
FIGS. 1A to 1E are views for describing a method of forming organic thin film transistor according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when one element is referred to as being 'on' another element, it can be directly on the other element, or intervening elements may also be present. In the figures, moreover, the dimensions of elements are exaggerated for clarity of illustration. Like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Though terms like a first, a second, and a third are used to describe various elements in various embodiments of the present invention, the elements are not limited to these terms. It will be understood that although the terms first, second and third are used herein to describe various elements, these elements should not be limited by these terms. An embodiment described and exemplified herein includes a complementary embodiment thereof.

The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIGS. 1A to 1E are views for describing a method of forming organic thin film transistor according to an embodiment of the present invention.

Referring to FIG. 1A, a gate electrode 110 is formed on the substrate 100. The substrate 100 may be formed as a glass substrate or a plastic substrate. The plastic substrate may be formed of a polymer compound such as polyimide, polyethylenenaphthalate (PEN) or polyethylene terephthalate (PET).

The gate electrode 110 is formed by forming and patterning a conductive layer (not shown) on the substrate 100, or it is formed in a process that covers the substrate 100 with a patterned mask and forms the conductive layer. The gate electrode 110 may be formed in any one of a thermal evaporation process, an E-beam evaporation process, a sputtering process, a micro contact printing process or a nano imprinting process. The gate electrode 110 may be formed of metal material such as aluminum (Al), chrome (Cr), molybdenum (Mo), copper (Cu), titanium (Ti) or tantalum (Ta), or it may be formed of non-metal material having conductivity.

An auxiliary gate dielectric 112 covering the gate electrode 110 is formed on the substrate 100. The auxiliary gate dielectric 112 may be formed with a dispenser in a dispensing process. The dispensing process may be useful when the organic thin film transistor is formed in a roll-to-roll process. Alternatively, the auxiliary gate dielectric 112 may be formed in a spin coating process.

The auxiliary gate dielectric 112 may substantially include a planar upper surface. The auxiliary gate dielectric 112 may be formed of an insulating material capable of transmitting ultraviolet. For example, the auxiliary gate dielectric 112 may be formed of a material such as poly-4-vinylphenol (PVP), polyimide, polyvinylalcohol (PVA) or polystyrene (PS). Alternatively, the auxiliary gate dielectric 112 may be formed of an inorganic/organic hybrid insulating material such as $Al_2O_3$/PS.

Figure 1B:
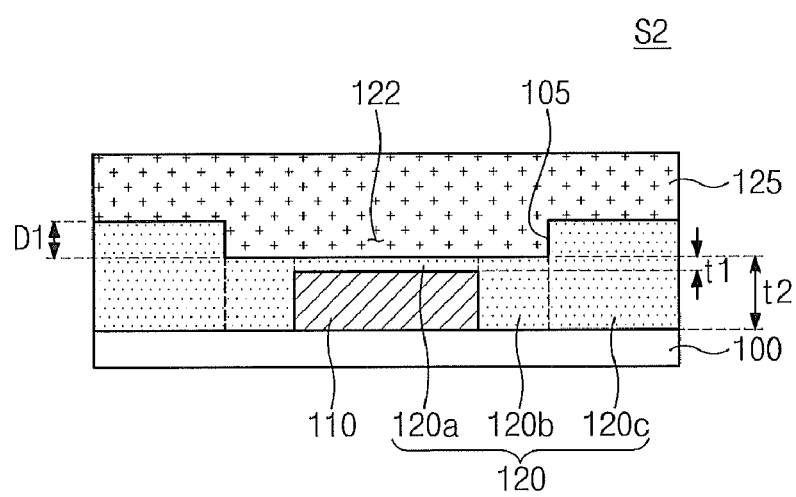

Referring to FIG. 1B, a recess region 105 may be formed at the upper portion of the auxiliary gate dielectric 112 by using a mold 125 including a convex portion 122. A process of forming the recess region 105 may be called an imprinting process. The auxiliary gate dielectric 112 may have liquidity so that the recess region 105 may be formed. That is, in a state where the auxiliary gate dielectric 112 has liquidity so that a shape may be changed by the mold 125, the shape of the convex portion 122 of the mold 125 may be carved in the auxiliary gate dielectric 112.

After the recess region 105 is formed, a gate dielectric 120 is formed by curing the auxiliary gate dielectric 112. The gate dielectric 120 may be formed in a thermal curing process. The thermal curing process may be performed at a temperature lower than 200° C. Since the thermal curing process is performed at a relatively low temperature, the damage of the substrate 100 can be minimized Alternatively, the gate dielectric 120 may be cured using ultraviolet.

Forming the gate dielectric 120 may include: forming a first gate dielectric 120a between the gate electrode 110 and the recess region 105; and forming a second gate dielectric 120b between the substrate 100 and the recess region 105. A thickness t1 of the first gate dielectric 120a is thinner than a thickness t2 of the second gate dielectric 120b, and a thickness t3 of the auxiliary gate dielectric 112 is thicker than the thickness t2 of the second gate dielectric 120b. The gate dielectric 120 may include a third gate dielectric 120c that is not recessed, and a thickness of the third gate dielectric 120c may be the substantially same as the thickness t3 of the auxiliary gate dielectric 112. The depth D1 of the recess region 105 may be limited by controlling the thickness of the first gate dielectric 120a.

The first gate dielectric 120a is an element that determines the operating voltage of the organic thin film transistor. Since the first gate dielectric 120a is formed to have a relatively thin thickness, the operating voltage of the organic thin film transistor can be reduced. That is, the auxiliary gate dielectric 112 is recessed, and thus the first gate dielectric 120a having a thin thickness may be formed.

Figure 1C:
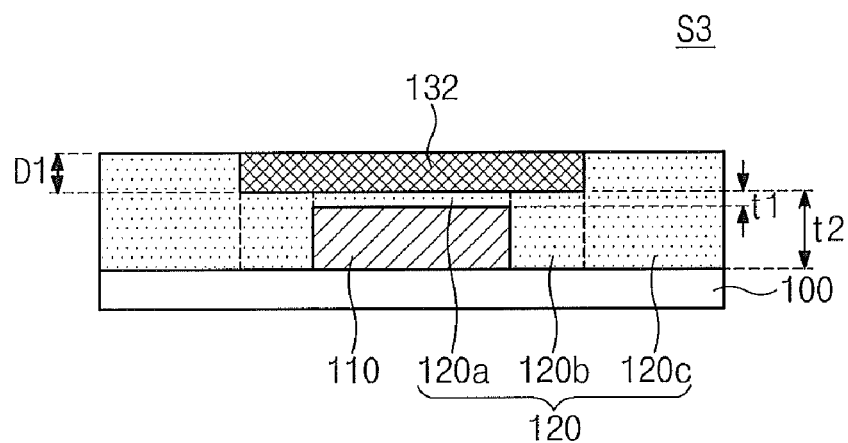

Referring to FIG. 1C, after the mold 125 is removed, a conductive layer 132 may be formed in the recess region 105. The conductive layer 132 may be formed of an ultraviolet (UV)-curable conductive material. Specifically, the conductive layer 132 may be formed of a paste or an ink where conductive powders such as argentums (Ag), aurum (Au), zinc (Zn), Cu, carbon nano tube and polymer are dispersed in a UV-curing resin. The UV-curing resin may contain a photoinitiator that reacts on UV energy. In case that the conductive layer 132 is formed of a conductive ink, it may be formed in an inkjet printing process.

Figure 1D:
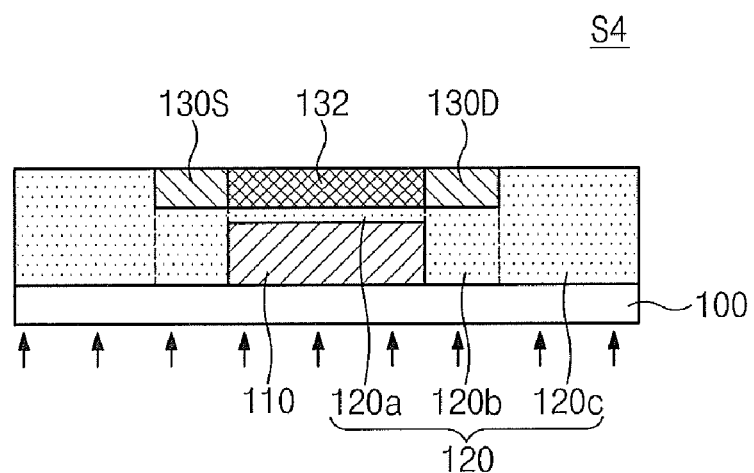

Referring to FIG. 1D, the conductive layer 132 formed at the both sides of the gate electrode 110 is cured by performing an exposure process by using the gate electrode 110 as a mask. A source electrode 130S and a drain electrode 130D are formed by curing the conductive layer 132. The exposure process may be performed in order for UV to be exposed from the rear surface of substrate 100. Accordingly, the substrate 100 and the gate dielectric 120 may be formed of UV-transmissive materials.

An exposure process may be performed using the gate electrode 110 as a mask, and thus the source electrode 130S and the drain electrode 130D may be self-aligned with the gate electrode 110 and formed. Specifically, the shine intensity of UV may be about 7 mW/cm$^2$ and a shining time of UV may be about 60 min in the exposure process. A portion of the conductive layer 132 that is screened by the gate electrode 110 may maintain physical properties as-is, but another portion of the conductive layer 132 that is not screened by the gate electrode 110 may be cured by UV and its physical properties are changed.

Figure 1E:
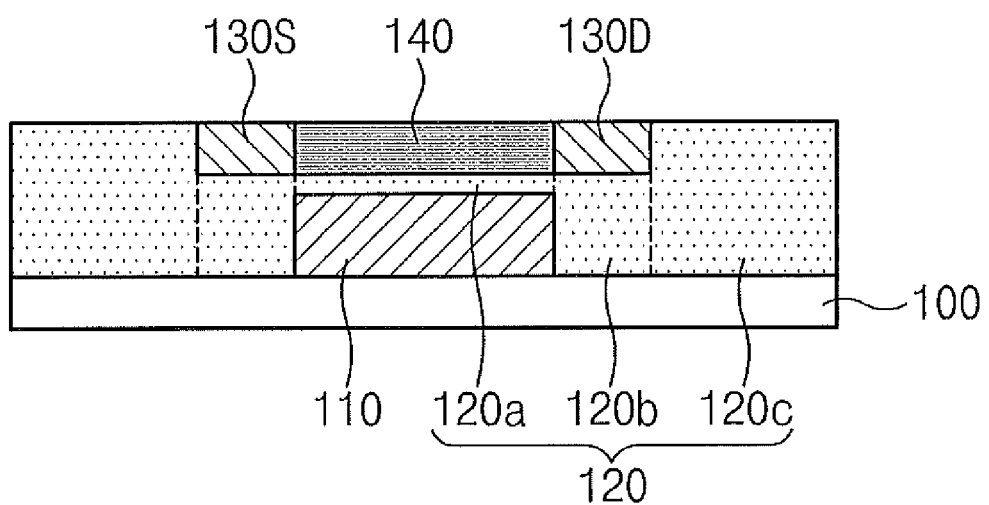

Referring to FIG. 1E, the uncured conductive layer 132 is removed. The conductive layer 132, for example, may be removed by a developer in a development process. An organic semiconductor layer 140 is formed between the source electrode 130S and the drain electrode 130D in the recess region 105. The organic semiconductor layer 140 may be formed of any one of Tips-Pentacene[6,13-bis(triisopropylsilylethynyl) pentacene], P3HT [poly(3-hexylthiophene)], F8T2[poly (9,9-dioctylfluoreneco-bithiophene)], PQT-12[poly(3,3-didodecylquarter-thiophene) or PBTTT[poly(2,5-bis(3-tetradecylthiophen-2yl)thieno[3,2-b]thiophene). The organic semiconductor layer 140 may be formed in an inkjet printing process. The organic semiconductor layer 140 may be formed so as to be self-aligned with the source electrode 130S and the drain electrode 130D that have been formed in advance.

According to an embodiment of the present invention, the gate dielectric 120 (particularly, the first gate dielectric 120a) of the organic thin film transistor is thinly formed, thereby decreasing the operating voltage. Moreover, since the source electrode 130S, the drain electrode 130D and the organic semiconductor layer 140 are formed to be self-aligned, a forming process can be simplified and electrical characteristics can be improved. Since the source electrode 130S, the drain electrode 130D and the organic semiconductor layer 140 are formed in the recess region 105, the entire thickness of the organic thin film transistor can be reduced and the scaling down of the device is enabled. Furthermore, the gate dielectric 120 can be thinly formed in a simple imprinting process.

Figure 2:
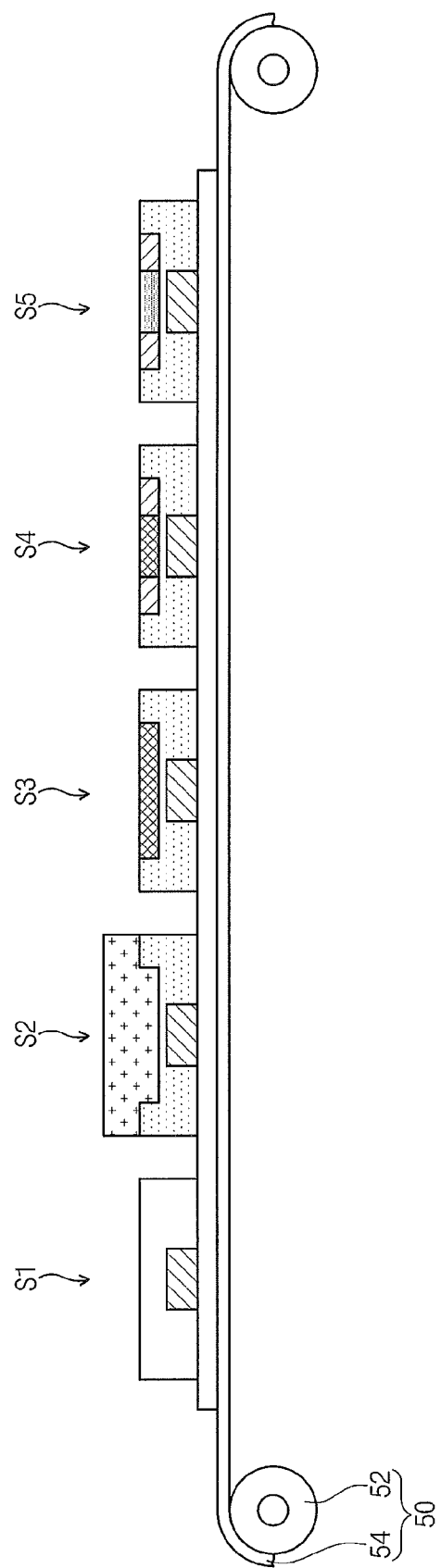
FIG. 2 is a diagram for describing a method of forming organic thin film transistor in a roll-to-roll process according to another embodiment of the present invention.

FIG. 2 is a diagram for describing a method of forming organic thin film transistor in a roll-to-roll process according to another embodiment of the present invention. Except for a difference in that an organic thin film transistor is formed in a roll-to-roll process, this embodiment is similar to the preceding embodiment. For conciseness, accordingly, a repetitive description on the same technical features will be omitted. In FIGS. 2, S1, S2, S3, S4 and S5 indicate the processes that have been described above with reference to FIGS. 1A to 1E, respectively. In FIG. 2, reference numeral is omitted, and a description will be made below by referencing the reference numerals of FIGS. 1A to 1E.

Referring to FIGS. 1A to 1E and FIG. 2, an organic thin film transistor is formed in a roll-to-roll process. In a method of forming organic thin film transistor, all processes may be performed in a state where the substrate 100 is continuously conveyed. The substrate 100 is prepared on a roller device 50 that includes a feed roller 52 and a feed plate 54. First, the gate electrode 110 is formed on the substrate 100. Next, the substrate 100 is conveyed by the roller device 50, and thereby the gate dielectric 120 is formed. As described above, the gate dielectric 120 may be formed in a dispensing process. The gate dielectric 120 may be formed by forming the recess region 105 with the mold 125 (see FIG. 1B) and being cured.

The substrate 100 is conveyed by the roller device 50, and the conductive layer 132 is formed in the recess region 105 of the gate dielectric 120. The conductive layer 132 may be formed in an inkjet printing process. The conductive layer 132 is continuously exposed to UV and cured, and thereby the source electrode 130S and the drain electrode 130D may be self-aligned with the gate electrode 110. The organic semiconductor layer 140 may be formed 105 between the source electrode 130S and the drain electrode 130D in the recess region.

According to another embodiment of the present invention, the organic thin film transistor can be easily formed in the roll-to-roll process, thereby saving the cost.

Figure 3:
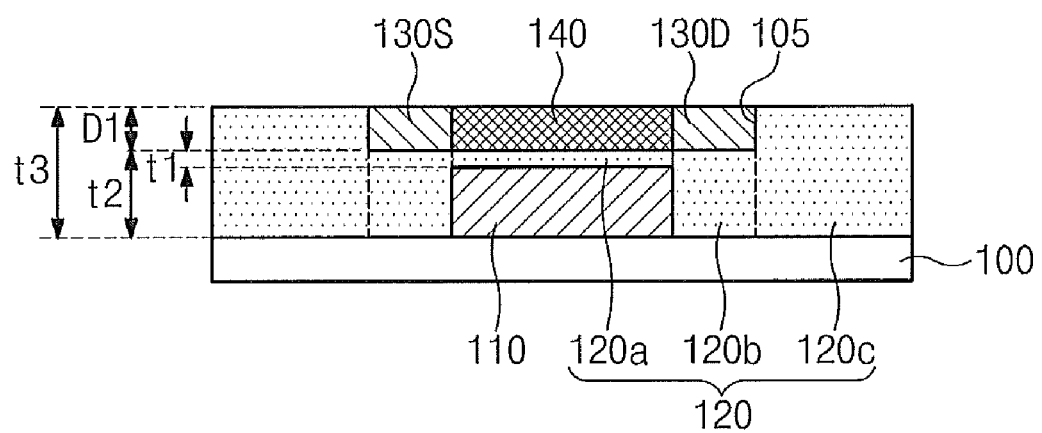
FIG. 3 is a diagram for describing an organic thin film transistor according to an embodiment of the present invention.

FIG. 3 is a diagram for describing an organic thin film transistor according to an embodiment of the present invention.

Referring to FIG. 3, the gate electrode 110 is disposed on the substrate 100. The substrate 100 may be a glass substrate or a plastic substrate. The plastic substrate may be formed of a polymer compound such as polyimide, polyethylenenaphthalate (PEN) or polyethylene terephthalate (PET). The gate electrode 110 may be formed of metal material such as aluminum (Al), chrome (Cr), molybdenum (Mo), copper (Cu), titanium (Ti) or tantalum (Ta), or it may be formed of non-metal material having conductivity.

The gate dielectric 120, which covers the gate electrode 110 and includes the recess region 105 in its upper portion, disposed on the substrate 100. The gate dielectric 120 may be formed of an insulating material capable of transmitting UV. For example, the gate dielectric 120 may be formed of a material such as poly-4-vinylphenol (PVP), polyimide, polyvinylalcohol (PVA) or polystyrene (PS). Alternatively, the gate dielectric 120 may be formed of an inorganic/organic hybrid insulating material such as $Al_2O_3$/PS.

The source electrode 130S and the drain electrode 130D are disposed in the recess region 105 of the gate dielectric 120. Specifically, the source electrode 130S and the drain electrode 130D may include a paste, an ink or conductive materials such as argentums (Ag), aurum (Au), zinc (Zn), Cu, carbon nano tube and polymer.

The organic semiconductor layer 140 is formed in the recess region 105 between the source electrode 130S and the drain electrode 130D. The organic semiconductor layer 140 may be formed of any one of Tips-Pentacene[6,13-bis(triisopropylsilylethynyl)pentacene], P3HT[poly(3-hexylthiophene)], F8T2[poly (9,9-dioctylfluoreneco-bithiophene)], PQT-12[poly(3,3-didodecylquarter-thiophene) or PBTTT [poly(2,5-bis(3-tetradecylthiophen-2yl)thieno[3,2-b] thiophene).

Lower surfaces of the source electrode 130S, drain electrode 130D and organic semiconductor layer 140 may be disposed on the same plane. Alternatively, the lower surfaces of the source electrode 130S, drain electrode 130D and organic semiconductor layer 140 may be parallel to an upper surface of the substrate 100.

The gate dielectric 120 may include the first gate dielectric 120a between the gate electrode 110 and the organic semiconductor layer 140, the second gate dielectric 120b between the substrate 100 and the source electrode 130S and between the substrate 100 and the drain electrode 130D, and the third gate dielectric 120c that is disposed on the substrate 100 and includes an upper surface having the same height as that of upper surfaces of the source electrode 130S and drain electrode 130D. A thickness t1 of the first gate dielectric 120a may be thinner than a thickness t2 of the second gate dielectric 120b.

A thickness t3 of the third gate dielectric 120c may be the substantially same as the sum of the thickness of the source electrode 130S or drain electrode 130D, the thickness t1 of the first gate dielectric 120a and the thickness of the gate electrode 110. Moreover, the thickness of the source electrode 130 and the thickness of the drain electrode 130D may be the substantially same as a depth D1 of the recess region 105.

The first gate dielectric 120a is an element that determines the operating voltage of the organic thin film transistor. Since the first gate dielectric 120a is formed to have a relatively thin thickness, the operating voltage of the organic thin film transistor can be reduced. That is, the auxiliary gate dielectric 112 is recessed, and thus the first gate dielectric 120a having a thin thickness may be disposed.

The source electrode 130S and the drain electrode 130D may be disposed so as to be self-aligned with the gate electrode 110. The organic semiconductor layer 140 may be disposed so as to be self-aligned with the source electrode 130S and the drain electrode 130D. That is, side surfaces where the source electrode 130S contacts the organic semiconductor layer 140 and the drain electrode 130D contacts the organic semiconductor layer 140, and each of both side surfaces of the gate electrode 110 may be disposed on the substantially same virtual plane.

According to an embodiment of the present invention, the gate dielectric 120 (particularly, the first gate dielectric 120a) of the organic thin film transistor has a thin thickness, thereby decreasing the operating voltage. Moreover, since the source electrode 130S, the drain electrode 130D and the organic semiconductor layer 140 are disposed to be self-aligned, electrical characteristics can be improved. Since the source electrode 130S, the drain electrode 130D and the organic semiconductor layer 140 are disposed in the recess region 105, the thickness of the organic thin film transistor can be reduced and the scaling down of the device is enabled.

According to embodiments of the present invention, the gate dielectric (particularly, the gate dielectric between the gate electrode and the organic semiconductor layer) of the organic thin film transistor is thinly formed, thereby decreasing the operating voltage. Moreover, since the source electrode, the drain electrode and the organic semiconductor layer are formed to be self-aligned, a forming process can be simplified and electrical characteristics can be improved. Since the source electrode, the drain electrode and the organic semiconductor layer are formed in the recess region, an entire thickness of the organic thin film transistor can be reduced and the scaling down of the device is enabled. Furthermore, the gate dielectric can be thinly formed in a simple imprinting process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming organic thin film transistor, the method comprising:
    forming a gate electrode on a substrate;
    forming a gate dielectric, which covers the gate electrode and comprises a recess region at an upper portion, on the substrate;
    forming a source electrode and a drain electrode in the recess region; and
    forming an organic semiconductor layer between the source electrode and the drain electrode in the recess region;
    wherein forming the source electrode, the drain electrode, the organic semiconductor layer and the gate electrode includes aligning a side surface where the source electrode contacts the organic semiconductor layer with a side surface of the gate electrode, and aligning a side surface where the drain electrode contacts the organic semiconductor layer with another side surface of the gate electrode.

2. The method of claim 1, wherein the forming of a gate dielectric comprises:
    forming an auxiliary gate dielectric on the substrate; and
    performing an imprinting process with a mold comprising a convex portion to form the recess region at an upper portion of the auxiliary gate dielectric.

3. The method of claim 2, wherein the forming of a gate dielectric further comprises curing the auxiliary gate dielectric after forming the recess region.

4. A method of forming organic thin film transistor, the method comprising:
    forming a gate electrode on a substrate;
    forming a gate dielectric, which covers the gate electrode and comprises a recess region at an upper portion, on the substrate;
    forming a source electrode and a drain electrode in the recess region; and
    forming an organic semiconductor layer between the source electrode and the drain electrode in the recess region;
    wherein the forming of a gate dielectric comprises
        forming an auxiliary gate dielectric on the substrate,
        performing an imprinting process with a mold comprising a convex portion to form the recess region at an upper portion of the auxiliary gate dielectric,
        forming a first gate dielectric between the gate electrode and the recess region, and
        forming a second gate dielectric between the substrate and the recess region, wherein a thickness of the first gate dielectric is thinner than a thickness of the second gate dielectric, and a thickness of the auxiliary gate dielectric is thicker than a thickness of the second gate dielectric.

5. The method of claim 2, wherein the auxiliary gate dielectric is formed of an organic insulator.

6. The method of claim 1, wherein the forming of a source electrode and a drain electrode comprises:

forming a conductive layer in the recess region; and curing a conductive layer which is formed at both sides of the gate electrode.

7. The method of claim 6, wherein the curing of a conductive layer comprises performing an exposure process on the conductive layer by using the gate electrode as a mask.

8. The method of claim 7, wherein the gate dielectric is formed of an ultraviolet-transmissive insulating material.

9. The method of claim 6, wherein the source electrode and the drain electrode are formed so as to be self-aligned with the gate electrode.

10. The method of claim 6, wherein the conductive layer is formed of an conductive ink.

11. The method of claim 6, wherein the conductive layer is formed in an inkjet printing process.

12. The method of claim 6, wherein the forming of the source electrode and the drain electrode further comprises removing the conductive layer between the source electrode and the drain electrode after curing the conductive layer.

13. The method of claim 1, wherein the organic semiconductor layer is formed so as to be self-aligned with the source electrode and the drain electrode.

14. The method of claim 1, wherein the organic semiconductor layer is formed in an inkjet printing process.

* * * * *